United States Patent [19]

Kasahara et al.

[11] Patent Number: 5,220,193

[45] Date of Patent: Jun. 15, 1993

[54] VARIABLE-CAPACITANCE DIODE DEVICE WITH COMMON ELECTRODE

[75] Inventors: Takeshi Kasahara; Haruhiko Taguchi, both of Tsurugashima, Japan

[73] Assignee: Toko Kabushiki Kaisha, Tokyo, Japan

[21] Appl. No.: 775,034

[22] Filed: Oct. 11, 1991

[30] Foreign Application Priority Data

Oct. 16, 1990 [JP] Japan ................................. 2-277537

[51] Int. Cl.$^5$ ............................................. H01L 29/92
[52] U.S. Cl. .................................... 257/595; 257/601; 257/602; 257/598; 257/784
[58] Field of Search ......................... 357/14, 70, 69, 68

[56] References Cited

U.S. PATENT DOCUMENTS

| | | | |
|---|---|---|---|
| 3,374,537 | 3/1968 | Doelp, Jr. ......................... | 357/70 X |
| 3,395,447 | 8/1968 | Beyerlein ......................... | 357/70 X |
| 3,893,147 | 7/1975 | William et al. ................... | 357/14 |
| 4,023,053 | 5/1977 | Shimizu et al. .................... | 357/14 X |
| 4,456,917 | 6/1984 | Sato et al. ........................ | 357/14 |
| 4,529,995 | 7/1985 | Sakai et al. ...................... | 357/14 |
| 5,017,950 | 5/1991 | Kasahara .......................... | 357/14 |

*Primary Examiner*—William Mintel
*Attorney, Agent, or Firm*—Stevens, Davis, Miller & Mosher

[57] ABSTRACT

A plurality of variable-capacitance diode elements are formed in the top of a semiconductor substrate. The rear surface of the substrate is connected to a first lead frame that acts as a common electrode for one electrode from each of the variable-capacitance diode elements. Each of the other electrodes of the variable-capacitance diode elements is connected by a wire to a second lead frame. In this manner, a single variable-capacitance diode device is formed between the first and second lead frames by a plurality of variable-capacitance diode elements.

3 Claims, 2 Drawing Sheets

VARIABLE-CAPACITANCE DIODE DEVICE WITH COMMON ELECTRODE

TECHNICAL FIELD

The present invention relates to a variable-capacitance diode device and, more particularly, to a diode device suitable for use as a high-frequency tuning element that has a high-frequency series resistance $R_S$.

BACKGROUND ART

A conventional variable-capacitance diode device that is used as a tuning device for high frequencies has a maximum capacity of 0.1 to 15 pF, for an area of its PN junction and an area of a conductor film for a wire bonding are extremely small. Usually, a wire of a thick diameter cannot be used to bond a single gold wire or the like to a single variable-capacitance diode device, so a thin wire is used for the small area of the wire bonding.

PROBLEM TO BE SOLVED BY THE PRESENT INVENTION

A conventional variable-capacitance diode device acting as a tuning device for high frequencies has defects in that its small junction area and thin-diameter wire have the effect of increasing the high-frequency series resistance $R_S$ that is based on the skin effect of the high-frequency current, and the quality factor Q for tuning is deteriorated thereby.

SUMMARY

The present invention was designed with the aim of alleviating the above defects, and has as its main object the provision of a variable-capacitance diode device that has a reduced high-frequency series resistance $R_S$.

MEANS OF SOLVING THE PROBLEMS OF THE PRIOR ART

The variable-capacitance diode device of the present invention is characterized in comprising a plurality of variable-capacitance diode elements formed in a single chip; and an electrode from each of at least two of the plurality of variable-capacitance diode elements is connected by at least one wire per element to a lead frame, to form a common connection.

OPERATION

Since electricity passes through respective wires connected to each of the at least two of the variable-capacitance diode elements of the variable-capacitance diode device of the present invention, the area through which the high-frequency current flows is increased, thus reducing the high-frequency series resistance $R_S$.

EMBODIMENT OF THE PRESENT INVENTION

Figure 1:
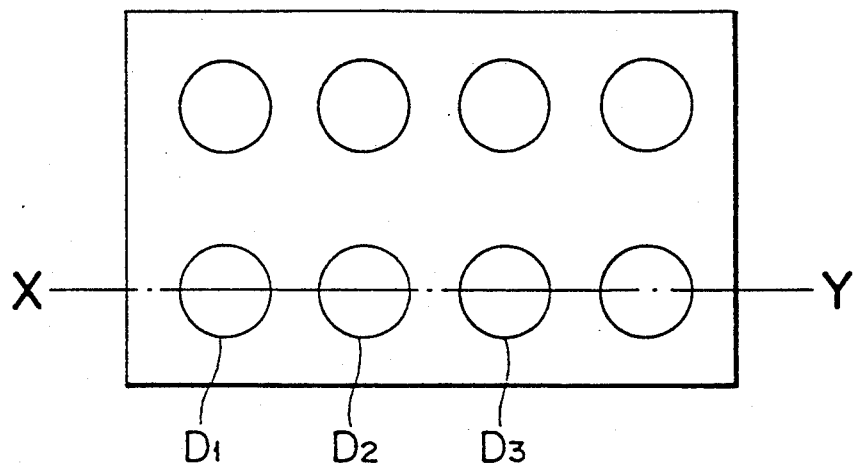
FIG. 1 is a plan view of elements of one embodiment of the variable-capacitance diode device of the present.
Figure 2:
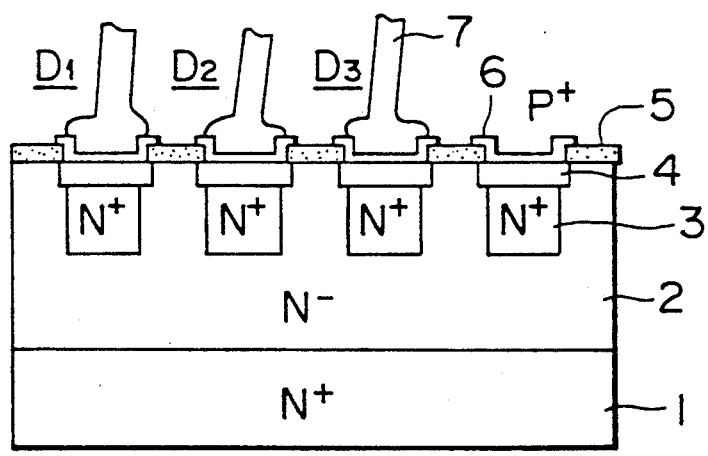
FIG. 2 is a cross-section taken along the line X—Y of FIG. 1.

FIG. 1 is a plan view of a high-frequency variable capacitance diode device relating to the present invention, and FIG. 2 is a cross-section taken along the line X—Y thereof.

An epitaxial layer 2 of N-type conductivity is formed on a main surface of a semiconductor substrate 1, as shown in FIG. 2. A plurality of diffusion layers 3 of N-type conductivity are formed in the epitaxial layer 2, and a PN junction is formed from a main surface exposed portion of each of the diffusion layers 3 by diffusing a diffusion layer of P-type conductivity 4 in such a manner as to cover the corresponding diffusion layer 3, to form variable-capacitance diode elements $D_1$, $D_2$, etc. Reference number 5 denotes an isolation film of a substance such as silicon dioxide. An electrode 6, as a conductor film, of a substance such as aluminum is formed in a main surface exposed portion of each of the elements $D_1$, $D_2$, etc., and a wire 7 is bonded to each electrode 6.

Figure 3:
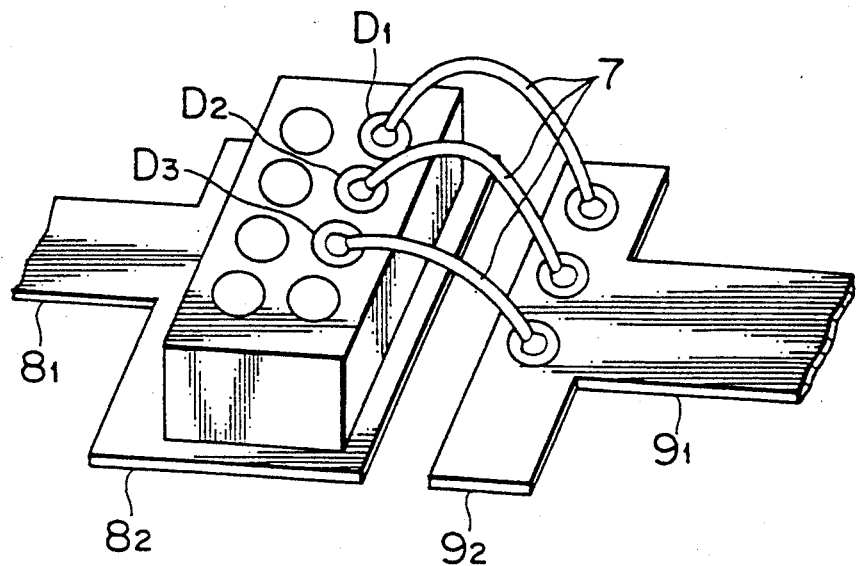
FIG. 3 is a perspective view of the variable-capacitance diode device mounted in a lead frame.

A perspective view of one embodiment of the variable-capacitance diode device of the present invention mounted in a lead frame is shown in FIG. 3. The chip is mounted on a tab lead $8_2$ at an end of a lead $8_1$, and a wire 7 connects each of elements $D_1$, $D_2$, and $D_3$ to a tab lead $9_1$ at an end of a lead $9_1$, so that the anodes of the variable-capacitance diode elements $D_1$, $D_2$, and $D_3$ are connected in common to the tab lead $9_2$.

Figure 4:
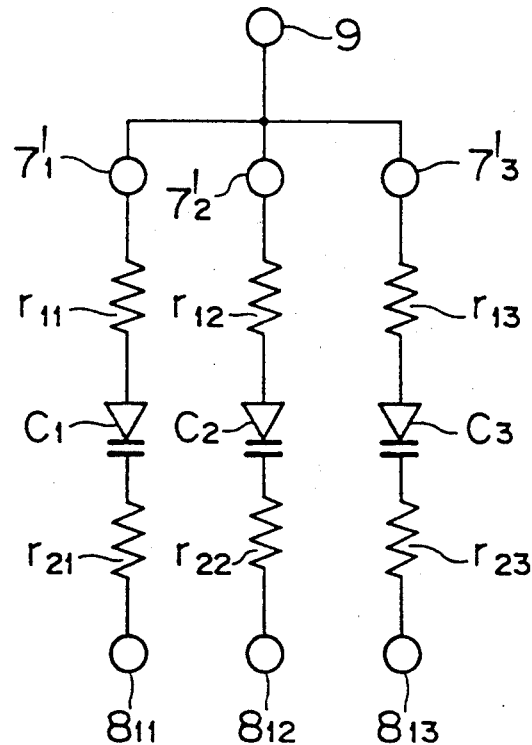
FIG. 4 is an equivalent circuit diagram of a variable-capacitance diode device relating to the present invention.

An equivalent circuit of the variable-capacitance diode device of FIG. 3 can be seen in FIG. 4.

The tab lead $9_2$ is represented by a terminal 9, the wires 7 are each represented by combinations of terminals $7_1'$ to $7_3'$ and resistances $r_{11}$ to $r_{13}$, the variable-capacitance diode elements $D_1$ to $D_3$ are represented by capacitors $C_1$ to $C_3$, the resistance components formed by the semiconductor substrate 1 at the lower part of the variable-capacitance diode elements $D_1$ to $D_3$ and the epitaxial layer 2 are represented by $r_{21}$ to $r_{23}$, and the tab lead $8_2$ is represented by terminals $8_{11}$ to $8_{13}$.

If the variable capacitance diode elements $D_1$, $D_2$, and $D_3$ shown in FIG. 3 are described based on FIG. 4, and the capacity of each of the variable-capacitance diode elements $D_1$, $D_2$, and $D_3$ is expressed as $C_1$, $C_2$, and $C_3$, respectively, the total maximum capacity $C_0$ can be expressed by the following equation:

$$C_0 = C_1 + C_2 + C_3 \qquad (1)$$

Similarly, if the high-frequency series resistance $R_S$ is expressed as total resistances $R_1$ to $R_3$ consisting of resistance components $r_{11}$ to $r_{13}$ and $r_{21}$ to $r_{23}$ between terminals $7_1'$ to $7_3'$ and $8_{11}$ and $8_{13}$, respectively, the total resistance $R_0$ thereof can be expressed by the following equation:

$$1/R_0 = 1/R_1 + 1/R_2 + 1/R_3 \qquad (2)$$

The total resistance $R_0$ of Equation (2) corresponds to the high-frequency series resistance $R_{S1}$.

Figure 5:
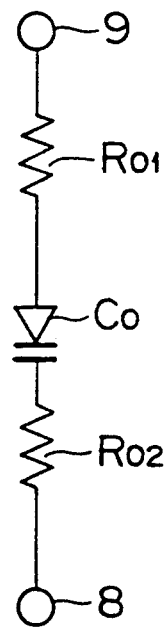
FIG. 5 is an equivalent circuit diagram of a conventional variable-capacitance diode device.

In other words, in accordance with the equivalent circuit of a conventional variable-capacitance diode device shown in FIG. 5, the high-frequency series resistance $R_{S2}$ can be expressed by:

$$1/R_{S2} = 1/R_{01} + 1/R_{02} \qquad (3)$$

Since the individual resistances are as follows:

$$R_{O1} = r_{11} = r_{12} = r_{13} \quad (4)$$

$$R_{O2} = r_{21} = r_{22} = r_{23} \quad (5)$$

the relationship between the high-frequency series resistance $R_{S1}$ of the variable-capacitance diode device of the present invention and the high-frequency series resistance $R_{S2}$ of the conventional variable-capacitance diode device is as follows:

$$R_{S1} < R_{S2} \quad (6)$$

In the variable-capacitance diode device of the present invention described above, at least two of the plurality of variable-capacitance diode elements $D_1$, $D_2$, $D_3$, etc. formed on the single chip are connected in parallel, so that a variable-capacitance diode device of any specific capacity can be formed thereby, based on Equation (1), and also it is clear from relationship of Equation (6) that the high-frequency series resistance can be reduced thereby.

In addition, the peripheral surface area of the wire 7 of the variable-capacitance diode device of the present invention can be increased by providing a plurality of wires 7. Therefore, the high-frequency current flowing through the wires 7 can be increased over the case in which there is only one wire, so the high-frequency series resistance of the variable-capacitance diode device can be reduced. As a result, if the variable-capacitance diode device of the present invention is used in a tuning circuit, the quality factor Q for tuning can be increased.

Of course, a variable-capacitance diode device of any desired capacity can be formed by forming variable-capacitance diode elements of different PN junction areas and connecting these elements together in parallel.

EFFECT OF THE PRESENT INVENTION

The variable-capacitance diode device of the present invention forms a variable-capacitance diode device with at least the same number of wires as the number of elements, so that the high-frequency series resistance $R_S$ of the variable-capacitance diode device is reduced, enabling an increase in the quality factor Q for tuning and making it extremely suitable as a variable-capacitance diode device for high-frequency tuning.

In addition, the variable-capacitance diode device of the present invention has the advantage that it facilitates the formation of a variable-capacitance diode device of any specific maximum capacity, by enabling combinations of variable-capacitance diode elements in parallel.

Furthermore, the variable-capacitance diode device according to the present invention is not constructed as a variable-capacitance diode but a plurality of small variable-capacitance diodes for making-up a necessary capacitance so that it is advantageous to provide a variable-capacitance diode having a stabilized operation less based upon frequency.

We claim:

1. A variable-capacitance diode device for use as a high frequency tuning element, wherein a plurality of variable-capacitance diode elements are formed in a semiconductor substrate; a common electrode on a rear surface of said semiconductor substrate is connected to a first external terminal; and an electrode on each of at least two variable-capacitance diode elements of said plurality of variable-capacitance diode elements is connected in parallel by at least one wire per element to a second external terminal, whereby a single variable-capacitance diode device is formed using said at least two of said variable-capacitance diode elements.

2. A variable-capacitance diode device in accordance with claim 1, wherein said first and second external terminals are formed as tab leads.

3. A variable-capacitance diode device in accordance with claim 1, wherein said wires are of metal.

* * * * *